(12) United States Patent
Hollmer et al.

(10) Patent No.: US 6,185,130 B1
(45) Date of Patent: Feb. 6, 2001

(54) PROGRAMMABLE CURRENT SOURCE

(75) Inventors: Shane C. Hollmer, San Jose, CA (US); Joseph G. Pawletko, Germantown, MD (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/420,209

(22) Filed: Oct. 18, 1999

(51) Int. Cl.[7] .................................................. G11C 16/06

(52) U.S. Cl. ................................. 365/185.2; 365/185.21; 365/210

(58) Field of Search ............................... 365/185.2, 210, 365/185.21

(56) References Cited

U.S. PATENT DOCUMENTS

| 5,822,250 | * | 10/1998 | Krzentz | 365/185.2 |
| 5,867,427 | * | 2/1999 | Sato | 365/185.2 |
| 5,898,617 | * | 4/1999 | Bushey et al. | 365/185.2 |
| 5,966,330 | * | 10/1999 | Tang et al. | 365/185.2 |

* cited by examiner

*Primary Examiner*—Son T. Dinh
(74) *Attorney, Agent, or Firm*—Skjerven Morrill MacPherson LLP; Edward C. Kwok; David C. Hsia

(57) ABSTRACT

A programmable reference current source used with a memory array during test and user modes to program or erase verify. The reference current source is programmable so that optimal reference currents can be determined during test mode. A value representing the optimal reference current is stored so that the reference current source provides the determined reference current during user mode.

31 Claims, 3 Drawing Sheets

PROGRAMMABLE CURRENT SOURCE

FIELD OF THE INVENTION

The present invention is directed to a programmable current source and more specifically to a programmable current source that generates reference current through bit lines of a memory array.

RELATED ART

FIG. 1 illustrates a cross sectional view of a conventional memory transistor, also known as a memory cell. The memory transistor includes a control gate CG, a floating gate FG, a drain D, a source S, and a well W. Thin oxide layers isolate the floating gate FG from the control gate CG as well as the well W.

FIG. 2 schematically illustrates a conventional NAND type flash memory array 100 that includes numerous memory cells, each depicted in FIG. 1. A "string" includes a selection transistor $T_{i-1}$, memory transistors $M_{i-1}$ to $M_{i-j}$, and a selection transistor $T_{i-2}$, all being serially coupled. Each string can be coupled to a bit line $BL_j$ and a common source CS through selection transistors $T_{i-1}$ and $T_{i-2}$, respectively. The control gates for selection transistors $T_{i-1}$ and $T_{i-2}$ are respectively connected to selection lines $Sl_1$ and $Sl_2$. The control gates for the memory transistors $M_{i-1}$ to $M_{i-j}$ are respectively connected to word lines $W_1$ to $W_j$. Typically, a read operation is performed on a page basis, i.e., flash memory cells coupled to a word line are read together.

Herein, a memory transistor represents logical LOW when it is programmed to have a threshold voltage that is larger than a predetermined minimum threshold voltage for logical LOW bits. Correspondingly, a memory transistor represents a logical HIGH when it is erased to have a threshold voltage that is less than a predetermined maximum threshold voltage for logical HIGH bits. One skilled in the art will understand that logic level assignments to the predetermined minimum and maximum threshold voltages are arbitrary.

A large variation in the programming and erasing characteristics of individual NAND type flash memory transistors among a memory array is common. The variations can be due to structural differences, which cause difference in threshold voltage characteristics. Such variations introduce differences in programming and erasing speeds among memory transistors.

After program and erase operations, a reference current is provided through each bitline $BL_j$ (FIG. 2) to determine whether the program and erase operation successful completed. Because of the variation in realized memory arrays, different reference currents may be needed for each realized memory array. Thus what is needed is a method and apparatus to determine and apply a suitable reference current.

SUMMARY

An embodiment of the present invention includes a programmable current source that provides current to a bit line coupled to a memory cell, the current source including a source of a reference current value and a reference current source that provides a reference current specified by the reference current value.

Advantageously, the programmable reference current source is used to both determine an optimal reference current level and subsequently apply the optimal reference current. Thus, an optimal reference current level can be quickly determined. In one embodiment, the level of optimal reference current is stored and used to generate the optimal reference current.

Various embodiments of the present invention will be more fully understood in light of the following detailed description taken together with the accompanying drawings.

BRIEF DESCRIPTION OF THE DRAWINGS

Note that use of the same reference numbers in different figures indicates the same or like elements.

DETAILED DESCRIPTION

Overview

Figure 1:
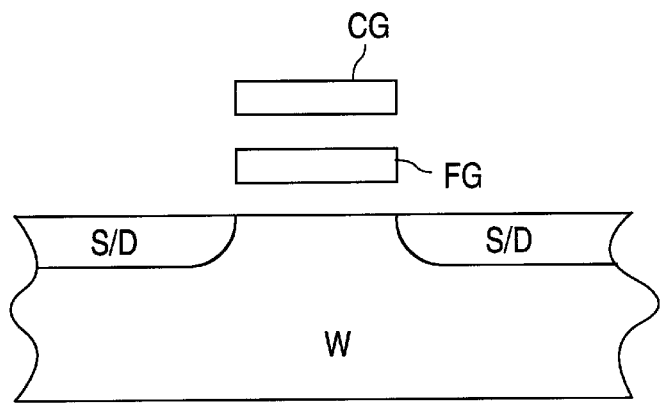
FIG. 1 illustrates a cross sectional view of a conventional memory transistor.
Figure 2:
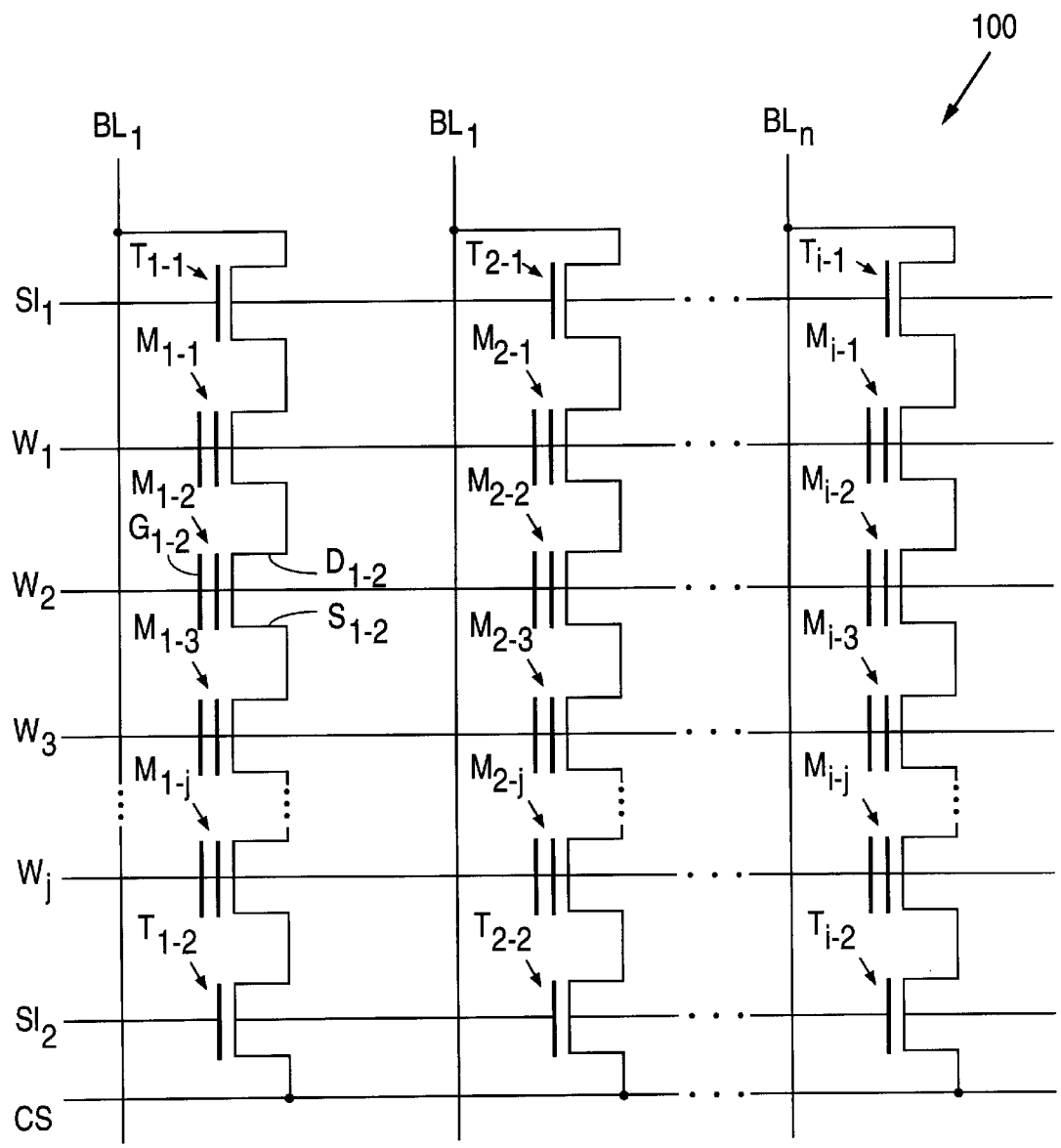
FIG. 2 schematically illustrates a conventional NAND type flash memory array 100.
Figure 3:
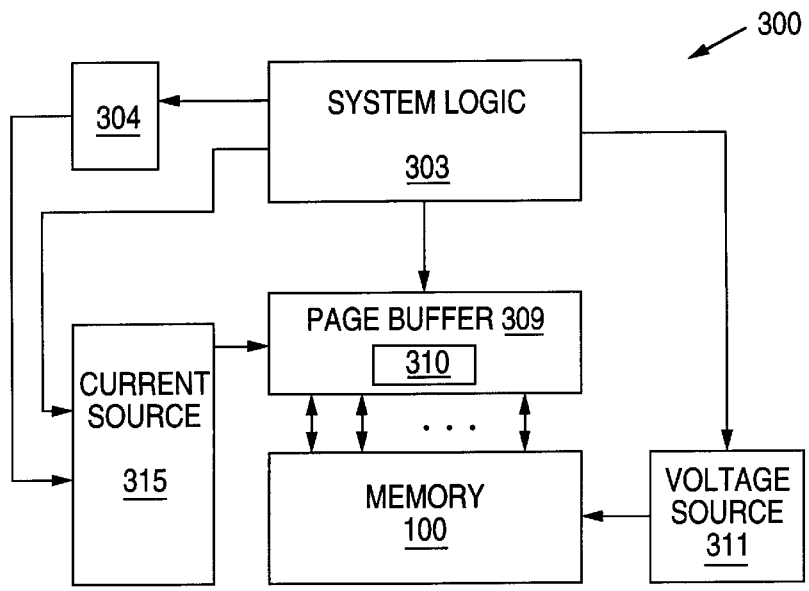
FIG. 3 schematically depicts a memory system 300 in accordance with an embodiment of the present invention.

FIG. 3 schematically depicts a memory system 300 in accordance with an embodiment of the present invention. Memory system 300 includes a system logic 303 that controls the operation of memory system 300; a conventional memory array 100, described earlier; a conventional voltage source 311 used to generate voltages to program or erase selected memory cells of memory array 100; a page buffer 309 that is used to identify and/or set the state of memory cells; and a current source 315 that generates reference currents through selected bitlines of memory array 100, where reference current levels are specified by the contents of either reference current storage 304 or an external device such as a test system. Memory system 300 is described in more detail later.

Memory system 300 operates in either a "test" mode or a "user" mode. In test mode, an optimal reference current is determined by specifying a reference current value and using the current source 315 to generate the associated reference current. The optimal reference current value is next stored into reference current storage 304 for use by current source 315 in so called "user mode", i.e., by customers of the memory system 300.

For example, during test mode, a test equipment (not depicted) commands system logic 303 to enter test mode operation. Next, test equipment sets a level of reference current and commands reference current source 315 (FIGS. 3 and 5A) to output the specified reference current. If the output current level is within an acceptable reference current range, then the test equipment stores the reference current into the reference current storage 304 (FIG. 3) for use in "user mode".

System Logic 303

In this embodiment, system logic 303 is implemented as hardwired logic. Of course, system logic 303 could be implemented in software executed by a microprocessor.

Voltage Source 311

Techniques to program and erase memory cells are well known. See for example, U.S. Pat. No. 5,812,457, entitled "Semiconductor NAND type flash memory with incremental step pulse programming", to inventors Arase et al., which is incorporated herein by reference in its entirety.

Of course, though not depicted, conventional X and Y address decoders are used. For an exemplary X-decoder, see U.S. Pat. No. 5,852,576, entitled "High voltage NMOS pass gate for integrated circuit with high voltage generator and flash non-volatile memory device having the pass gate", inventors Le et al. and U.S. Pat. No. 5,844,840, entitled "High voltage NMOS pass gate having supply range, area, and speed advantages", inventors Le et al., which are incorporated herein by reference in their entirety.

Storage Circuit 304

Storage circuit 304 stores a reference current value. A suitable implementation of storage circuit 304 is a conventional memory array (storing, e.g., 5 bits).

Page Buffer 309

Figure 4:
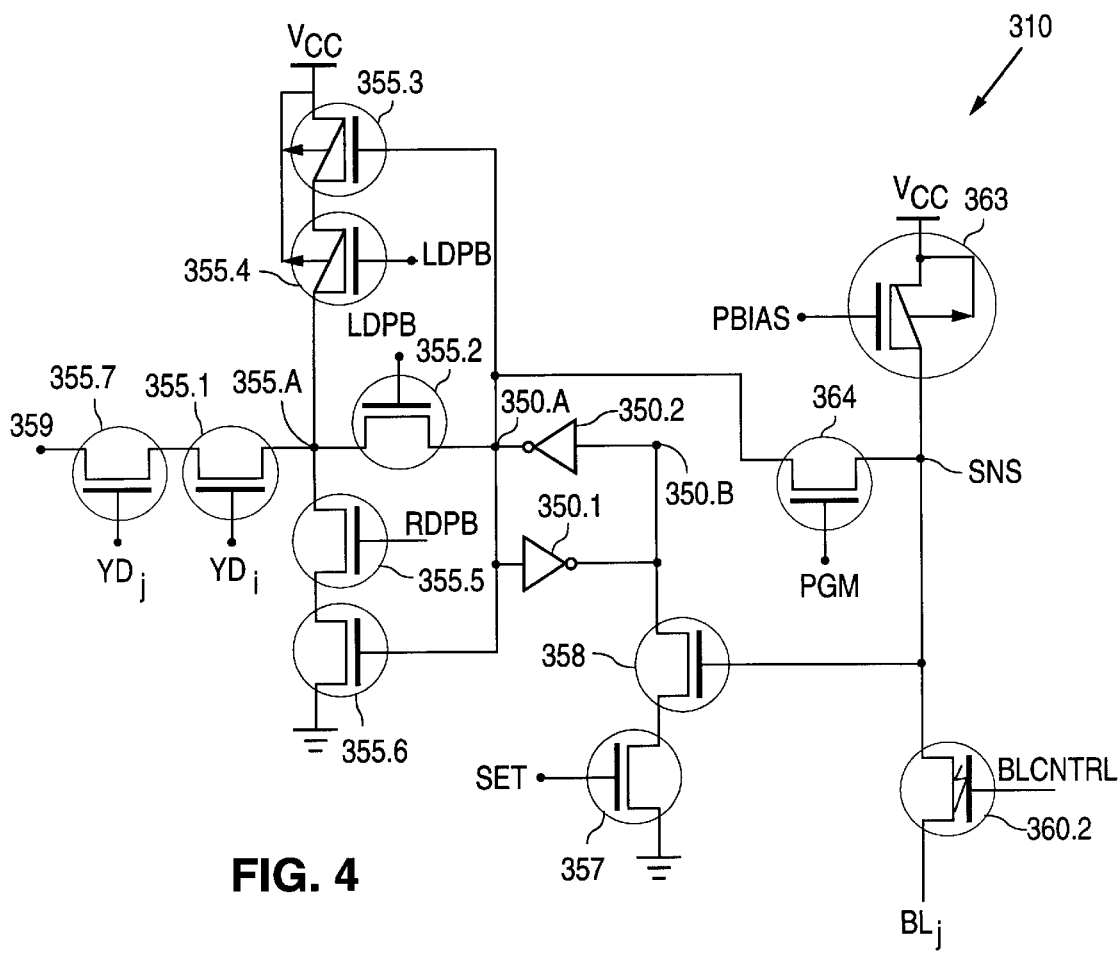
FIG. 4 schematically depicts a suitable implementation of latch and sensing circuitry 310 for each bit in the page buffer 309.

Each bit line, BLj, of memory array 100 is coupled to page buffer 309. FIG. 4 schematically depicts a suitable implementation of latch and sensing circuitry 310 for each bit in the page buffer 309. Of course, any conventional latch and sensing circuitry can be used. In this embodiment, reference current source 315 generates a current through selected bit lines, BLj, of latch and sensing circuitry 310 to determine the state of selected memory cells.

Conventional data latch includes inverter 350.1 coupled to an inverter 350.2. Outputs of inverters 350.1 and 350.2 are coupled to respective nodes 350.B and 350.A.

In one embodiment, load circuitry is used to specify which bits are to be programmed. Load circuitry includes NMOS transistors 355.2, 355.5, and 355.6 and PMOS transistors 355.3 and 355.4.

Transistors 355.2, 355.3, and 355.4 together allow a load operation of node 350.A when signal LDPB is HIGH. Transistor 355.2 passes the voltage present at node 355.A to node 350.A when LDPB is logical HIGH.

Transistors 355.3, 355.4, 355.5, and 355.6 together allow a read operation when signal RDPB is HIGH. Transistor 355.5 allows transistor 355.6 to control node 355.A when RDPB is logical HIGH and node 350.A is logical HIGH.

In this embodiment, transistors 355.1 and 355.7 selectively couple node 359 to node 355.A. When a HIGH signal is provided to each of the gate terminals of transistors 355.1 and 355.7, the signal at node 359 is transferred to node 355.A or vice versa. A conventional address decoder (not depicted) provides inputs of YDi and YDj to gate terminals of respective transistors 355.1 and 355.7. A suitable address decoder is described for example in U.S. Pat. No. 5,852,576, entitled "High voltage NMOS pass gate for integrated circuit with high voltage generator and flash non-volatile memory device having the pass gate", inventors Le et al. and U.S. Pat. No. 5,844,840, entitled "High voltage NMOS pass gate having supply range, area, and speed advantages", inventors Le et al., which are incorporated herein by reference in their entirety.

Transistors 357 and 358 are arranged so that if SNS node is HIGH when the signal SET is HIGH, node 350.B will be pulled to ground. This will cause a logical LOW to be stored on node 350.B and a logical HIGH to be stored on node 350.A.

NMOS transistor 364 passes the voltage stored on node 350.A to SNS node of bit line BLj when signal PGM is a HIGH.

Bit line BLj includes low threshold NMOS transistor 360.2 and PMOS transistor 363. During sensing of the state of a memory cell connected to bit line BLj, the transistor 360.2 is used as a cascode device to amplify the bit line voltage. When the voltage bit line Blj approaches the BLCNTRL voltage, transistor 360.2 begins to turn off. This allows transistor 363 to pull the SNS node toward Vcc, thereby turning on transistor 358.

N-well and source terminals of p-channel transistor 363 are coupled to terminal Vcc. Input PBIAS to transistor 363 controls the level of reference current that flows through bit line BLj.

Reference Current Source 315

As is well known, the speed at which contents of memory cells are detected depends on the level of the reference current. Also well known is that the safety margin for properly reading of memory cells depends on the level of reference current. A high level of reference current in conjunction with parasitic resistance can lead to misreading of selected memory cells.

Figures 5A, 5B:
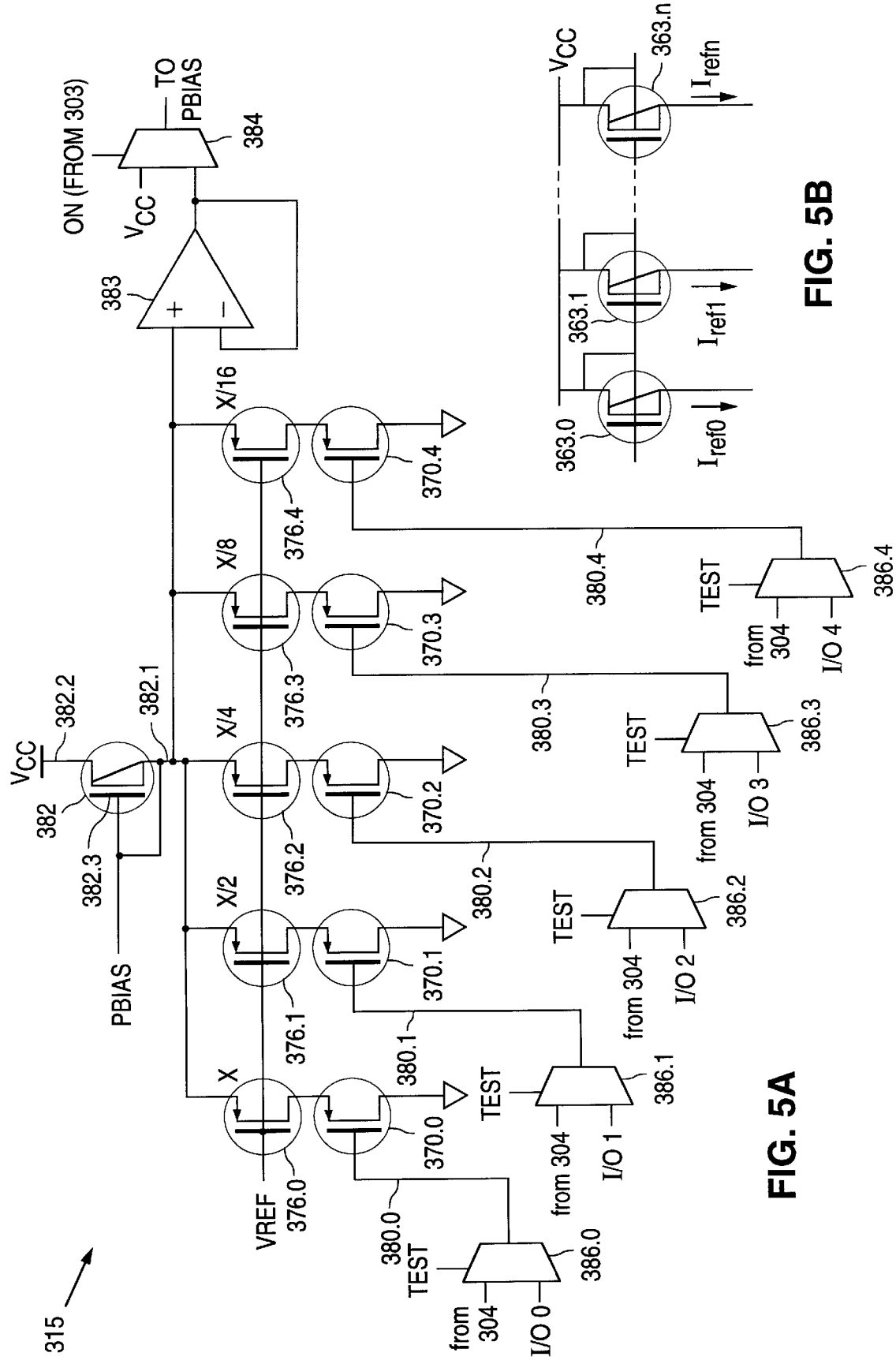
FIG. 5A illustrates a suitable embodiment of current source 315, in accordance with an embodiment of the present invention.
FIG. 5B illustrates a suitable coupling of transistors 363 of each latch and sensing circuitry 310 of FIG. 4 to current source 315.

In accordance with an embodiment of the present invention, the reference current, Iref, provided to the bit line BLj of each latch and sensing circuitry 310 is set by using current source 315, shown in more detail in FIG. 5A. During test mode, current source 315 allows for readily changing the reference current generated through each latch and sensing circuitry 310 to thereby determine an optimal reference current value. In user mode, the current source 315 generates the optimal level of current through each bit line of memory array 100.

Transistor 382 is a PMOS transistor that includes drain terminal 382.1, source terminal 382.2, and gate terminal 382.3. The transistor 382 has the same characteristics as transistor 363.j of each latch and sensing circuitry 310. Gate terminal 382.3 is coupled to drain terminal 382.1 so that transistor 382 is configured in a diode form. Drain terminal 382.1 is coupled to source terminals 378.0 to 378.4.

The drain terminal 382.1 is coupled to provide an input voltage to a unity gain buffer 383. The output of the unity gain buffer 383 is an input to MUX 384. A second input to MUX 384 is a voltage signal Vcc. When signal "ON" from system logic 303 is logical HIGH, MUX 384 outputs the input from unity gain buffer 383 or otherwise outputs voltage signal Vcc. The output of MUX 384 is coupled to terminal PBIAS of each latch and sensing circuitry 310, described earlier.

FIG. 5B illustrates the coupling of transistors 363 (FIG. 4) of each latch and sensing circuitry 310 (FIG. 4). When the voltage at the drain terminal 382.1 (FIG. 5A) is coupled to terminal PBIAS of each latch and sensing circuitry 310, because the transistor 363 and transistor 382 (FIG. 5A) match and because the gate-to-source voltages of each of transistors 363 and 382 match, the current into terminal PBIAS in each page buffer is the same. Thus the same reference current is replicated in each bit line.

As FIG. 5A illustrates, the current in drain terminal 382.1 is controlled by the current from transistors 376.0 to 376.4. Transistors 376.0 to 376.4 are each NMOS transistors. Each of transistors 376.0 to 376.4 includes a respective drain terminal 377.0 to 377.4, source terminals 378.0 to 378.4, and gate terminal 379.0 to 379.4. In this embodiment, the ratio of transistor size of transistors 376.0 to 376.4 is 16:8:4:2:1. Consequently current into source terminals 378.0 to 378.4 of transistors 376.0 to 376.4 are of a ratio of 16:8:4:2:1. Each of source terminals 378.0 to 378.4 are coupled together. Each of gate terminals 379.0 to 379.4 are coupled together and to receive voltage signal Vref. In this embodiment, Vref is a band gap voltage of, e.g., 1.3 V.

Transistors 370.0 to 370.4 are each NMOS transistors. Each of transistors 370.0 to 370.4 includes a respective drain terminals 371.0 to 371.4, source terminals 372.0 to 372.4, and gate terminals 373.0 to 373.4. Output signals 380.0 to 380.4 are coupled to respective gate terminals 373.0 to 373.4. Each of drain terminals 371.0 to 371.4 is coupled to ground. Each of source terminals 372.0 to 372.4 is coupled to drain terminals 377.0 to 377.4 of transistors 376.0 to 376.4. Transistors 370.0 to 370.4 control whether current flows through respective transistors 376.0 to 376.4, described earlier.

Conventional multiplexers 386.0 to 386.4 are coupled to receive inputs from both reference current storage 304 and an external device, such as a conventional test equipment, that provides inputs of I/O$_0$ to I/O$_4$. Inputs to conventional multiplexers 386.0 to 386.4 are either logical HIGH or logical LOW. Input "TEST" to each multiplexer 386.0 to 386.4 from system logic 303 controls whether respective output signals 380.0 to 380.4 are either the input from reference current storage 304 or the signals I/O$_0$ to I/O$_4$.

In this embodiment, conventional latching circuitry (not depicted) is used to sustain the output signals 380.0 to 380.4 until such output signals are changed by respective multiplexers 386.0 to 386.4.

The output signals 380.0 to 380.4 selectively control whether current flows through any of respective transistors 370.0 to 370.4. Thus the total current through the drain terminal 382.1 of transistor 382 is the sum of currents into source terminals 378.0 to 378.4 of respective transistors 376.0 to 376.4.

In this embodiment, the total current in drain terminal 382.1 varies from X/16 to 2X, where X/16 is the current into source terminal 378.0, because transistors 376.0 to 376.4 are of a ratio of 16:8:4:2:1. Thus inputs to multiplexers 386.0 to 386.4 can vary the reference current to any value from X/16 to 2X.

Thus the local reference current source is used to determine a suitable reference current, Iref. In test mode, described in more detail later, a test equipment 302 can vary the inputs into multiplexers 386.0 to 386.4 dynamically to vary the reference current to establish a suitable Vt spread for erase and program as well as a suitable verify time. The reference current source 315 further allows for optimal reference currents to be determined and set for each potentially different physical implementation of memory system 300.

Use of reference current source 315 decreases test times of commercially suppliable memory devices, thereby increasing production capacity without need for additional capital equipment. This results in lower overall product cost. Also, reference current source 315 improves time to market by eliminating the need for circuit re-design when the reference current values need to change.

Modifications

The above-described embodiments of the present invention are illustrative and not limiting. It will thus be obvious to those skilled in the art that various changes and modifications may be made without departing from this invention in its broader aspects. For example, memory array 100 can be a NOR type. Therefore, the appended claims encompass all such changes and modifications as fall within the true spirit and scope of this invention.

What is claimed is:

1. A programmable current source that provides current to a bit line coupled to a memory cell, the current source comprising:

a source of a reference current value;

a reference current source that provides a reference current specified by the reference current value; and a storage device, wherein the reference current value is selectively stored into the storage device.

2. The programmable current source of claim 1, further comprising:

a selector circuit coupled to receive reference current values from both the source and the storage device, wherein the selector circuit selects a reference current value to transfer to the reference current source.

3. A programmable current source that provides current to a bit line coupled to a memory cell, the current source comprising:

a source of a reference current value; and a reference current source that provides a reference current specified by the reference current value, wherein the reference current value comprises N bits and wherein the reference current source comprises N current sources, each current source controlled by one of the N bits, and wherein each of the N current sources contribute to the reference current.

4. A programmable current source that provides current to a bit line coupled to a memory cell, the current source comprising:

a source of a reference current value;

a reference current source that provides a reference current specified by the reference current value, and wherein:

the bit line includes a line transistor and wherein the reference current source includes a source transistor;

the line transistor and source transistor are similar; and the reference current source provides a voltage to the source transistor thereby to match a current from the source transistor with a current from the line transistor.

5. A programmable current source that provides current to a bit line coupled to a memory cell, the current source comprising:

a source of a reference current value;

a reference current source that provides a reference current specified by the reference current value, wherein the reference current source comprises:

a source transistor, having a first, second, and third terminals, wherein the second and third terminals of the source transistor are coupled together;

M transistors, each having a first, second, and third terminals, wherein:

the third terminals of each of the M transistors are coupled together;

the second terminals of each of the M transistors are coupled together and are coupled to the first terminal of the source transistor;

the size of a jth transistor is half the size of a (j−1)th transistor, where j=0 to M;

each of the first terminals of the M transistors are coupled to a distinct switch; and the reference current value controls which of the M transistors are turned on.

6. The programmable current source of claim 5, wherein the bit line includes a line transistor having first, second, and third terminals, wherein the line transistor is similar to the source transistor, and wherein the reference current source further comprises:

a unity gain buffer coupled to receive an input from the first terminal of the source transistor, wherein the output of the unity gain buffer is selectively coupled to a first terminal of the line transistor.

7. A method of providing an adjustable reference current to a bit line coupled to a memory cell, the method comprising:
  providing a reference current value, wherein the act of providing further comprises selecting among at least two reference current values depending on a mode of operation; and
  outputting a reference current to the bit line, wherein the reference current is specified by the reference current value.

8. A method of providing an adjustable reference current to a bit line coupled to a memory cell, the method comprising:
  providing a reference current value, wherein the reference current value comprises a N bits; and
  outputting a reference current to the bit line, wherein the reference current is specified by the reference current value, wherein the act of outputting comprises the acts of:
    associating N current streams with each of the N bits; and
    selectively providing the current streams depending on the state of the
    combing the provided current streams thereby to provide the reference current.

9. The programmable current source of claim 1, wherein the reference current value comprises N bits and wherein the reference current source comprises N current sources, each current source controlled by one of the N bits, and wherein each of the N current sources contribute to the reference current.

10. The programmable current source of claim 1, wherein:
  the bit line includes a line transistor and wherein the reference current source includes a source transistor;
  the line transistor and source transistor are similar; and
  the reference current source provides a voltage to the source transistor thereby to match a current from the source transistor with a current from the line transistor.

11. The programmable current source of claim 1, wherein the reference current source comprises:
  a source transistor, having a first, second, and third terminals, wherein the second and third terminals of the source transistor are coupled together;
  M transistors, each having a first, second, and third terminals, wherein:
    the third terminals of each of the M transistors are coupled together;
    the second terminals of each of the M transistors are coupled together and are coupled to the first terminal of the source transistor;
    the size of a jth transistor is half the size of a (j−1)th transistor, where j=0 to M;
    each of the first terminals of the M transistors are coupled to a distinct switch; and
    the reference current value controls which of the M transistors are turned on.

12. The programmable current source of claim 11, wherein the bit line includes a line transistor having first, second, and third terminals, wherein the line transistor is similar to the source transistor, and wherein the reference current source further comprises:
  a unity gain buffer coupled to receive an input from the first terminal of the source transistor, wherein the output of the unity gain buffer is selectively coupled to a first terminal of the line transistor.

13. The programmable current source of claim 3, further comprising a storage device, wherein the reference current value is selectively stored into the storage device.

14. The programmable current source of claim 13, further comprising:
  a selector circuit coupled to receive reference current values from both the source and the storage device, wherein the selector circuit selects a reference current value to transfer to the reference current source.

15. The programmable current source of claim 3, wherein:
  the bit line includes a line transistor and wherein the reference current source includes a source transistor;
  the line transistor and source transistor are similar; and
  the reference current source provides a voltage to the source transistor thereby to match a current from the source transistor with a current from the line transistor.

16. The programmable current source of claim 3, wherein the reference current source comprises:
  a source transistor, having a first, second, and third terminals, wherein the second and third terminals of the source transistor are coupled together;
  M transistors, each having a first, second, and third terminals, wherein:
    the third terminals of each of the M transistors are coupled together;
    the second terminals of each of the M transistors are coupled together and are coupled to the first terminal of the source transistor;
    the size of a jth transistor is half the size of a (j−1)th transistor, where j=0 to M;
    each of the first terminals of the M transistors are coupled to a distinct switch; and
    the reference current value controls which of the M transistors are turned on.

17. The programmable current source of claim 16, wherein the bit line includes a line transistor, having first, second, and third terminals, wherein the line transistor is similar to the source transistor, and wherein the reference current source further comprises:
  a unity gain buffer coupled to receive an input from the first terminal of the source transistor, wherein the output of the unity gain buffer is selectively coupled to a first terminal of the line transistor.

18. The programmable current source of claim 4, further comprising a storage device, wherein the reference current value is selectively stored into the storage device.

19. The programmable current source of claim 18, further comprising:
  a selector circuit coupled to receive reference current values from both the source and the storage device, wherein the selector circuit selects a reference current value to transfer to the reference current source.

20. The programmable current source of claim 4, wherein the reference current value comprises N bits and wherein the reference current source comprises N current sources, each current source controlled by one of the N bits, and wherein each of the N current sources contribute to the reference current.

21. The programmable current source of claim 5, further comprising a storage device, wherein the reference current value is selectively stored into the storage device.

22. The programmable current source of claim 21, further comprising:
  a selector circuit coupled to receive reference current values from both the source and the storage device, wherein the selector circuit selects a reference current value to transfer to the reference current source.

23. The programmable current source of claim 5, wherein the reference current value comprises N bits and wherein the reference current source comprises N current sources, each current source controlled by one of the N bits, and wherein each of the N current sources contribute to the reference current.

24. The method of claim 7, wherein the reference current value comprises a N bits and wherein the act of outputting further comprises the acts of:
    associating N current streams with each of the N bits;
    selectively providing the current streams depending on the state of the N bits; and
    combining the provided current streams thereby to provide the reference current.

25. The method of claim 8, wherein the act of providing further comprises:
    selecting among at least two reference current values depending on a mode of operation.

26. A programmable current source that provides current to a bit line coupled to a memory cell, the current source comprising:
    a storage device storing a reference current value; and
    a reference current source that provides a reference current specified by the reference current value.

27. The programmable current source of claim 26, further comprising:
    a selector circuit coupled to receive reference current values from the storage device and another source, wherein the selector circuit selects a reference current value to transfer to the reference current source.

28. The programmable current source of claim 26, wherein the reference current value comprises N bits and wherein the reference current source comprises N current sources, each current source controlled by one of the N bits, and wherein each of the N current sources contribute to the reference current.

29. The programmable current source of claim 26, wherein:
    the bit line includes a line transistor and wherein the reference current source includes a source transistor;
    the line transistor and source transistor are similar; and
    the reference current source provides a voltage to the source transistor thereby to match a current from the source transistor with a current from the line transistor.

30. The programmable current source of claim 26, wherein the reference current source comprises:
    a source transistor, having a first, second, and third terminals, wherein the second and third terminals of the source transistor are coupled together;
    M transistors, each having a first, second, and third terminals, wherein:
        the third terminals of each of the M transistors are coupled together;
        the second terminals of each of the M transistors are coupled together and are coupled to the first terminal of the source transistor;
        the size of a jth transistor is half the size of a (j=1)th transistor, where j=0 to M;
        each of the first terminals of the M transistors are coupled to a distinct switch; and
        the reference current value controls which of the M transistors are turned on.

31. The programmable current source of claim 30, wherein the bit line includes a line transistor having first, second, and third terminals, wherein the line transistor is similar to the source transistor, and wherein the reference current source further comprises:
    a unity gain buffer coupled to receive an input from the first terminal of the source transistor, wherein the output of the unity gain buffer is selectively coupled to a first terminal of the line transistor.

* * * * *